United States Patent
Chen

(10) Patent No.: US 11,209,876 B1
(45) Date of Patent: Dec. 28, 2021

(54) DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventor: Min Chen, Wuhan (CN)

(*) Notice: Subject to any disclaimer, the term of this patent is extended or adjusted under 35 U.S.C. 154(b) by 156 days.

(21) Appl. No.: 16/652,993

(22) PCT Filed: Nov. 28, 2019

(86) PCT No.: PCT/CN2019/121407
§ 371 (c)(1),
(2) Date: Apr. 2, 2020

(87) PCT Pub. No.: WO2021/082154
PCT Pub. Date: May 6, 2021

(30) Foreign Application Priority Data

Oct. 28, 2019 (CN) .......................... 201911032516.3

(51) Int. Cl.
*H05K 1/02* (2006.01)
*G06F 1/18* (2006.01)
*H05K 1/18* (2006.01)
*H05K 1/03* (2006.01)

(52) U.S. Cl.
CPC .......... *G06F 1/189* (2013.01); *H05K 1/0298* (2013.01); *H05K 1/0306* (2013.01); *H05K 1/18* (2013.01); *H05K 2201/10128* (2013.01)

(58) Field of Classification Search
CPC ...... H05K 1/0298; H05K 1/0306; H05K 1/18; H05K 2201/10128
See application file for complete search history.

(56) References Cited

U.S. PATENT DOCUMENTS

| | | | |
|---|---|---|---|
| 2007/0031097 A1 | 2/2007 | Heikenfeld et al. | |
| 2014/0192278 A1* | 7/2014 | Esaka | G06F 3/0446 349/12 |
| 2017/0168608 A1* | 6/2017 | Kim | G06F 3/0446 |
| 2019/0164996 A1* | 5/2019 | Wang | H01L 29/78675 |

FOREIGN PATENT DOCUMENTS

| | | |
|---|---|---|
| CN | 101388372 A | 3/2009 |
| CN | 102270413 A | 12/2011 |
| CN | 106711173 A | 5/2017 |
| CN | 109887416 A | 6/2019 |

* cited by examiner

*Primary Examiner* — Sherman Ng

(57) ABSTRACT

The present application provides a display panel and an electronic device. The display panel includes display region and a non-display region surrounding the display region. The non-display region includes: an insulating substrate; a first wiring layer disposed on the insulating substrate, and the first wiring layer includes a plurality of first metal wirings arranged in parallel; a first insulating layer covering the first wiring layer and the insulating substrate; a second wiring layer disposed on the first insulating layer, and the second wiring layer comprises a plurality of second metal wirings arranged in parallel; and a second insulating layer covering the second wiring layer and the first insulating layer; wherein a minimum distance defined between the first wiring layer and the second wiring layer is greater than or equal to a preset distance.

14 Claims, 3 Drawing Sheets

DISPLAY PANEL AND ELECTRONIC DEVICE

BACKGROUND OF INVENTION

Field of Invention

The present application relates to the field of electronic display technology, and particularly to a display panel and an electronic device.

Description of Prior Art

Display panel generally includes a display region and a non-display region surrounding the display region. Metal wirings are disposed in the non-display region and used to transmit controlling signals to the display panel. Referring to FIG. 1, in order to ensure that mutual interference of different signals does not occur between the metal wirings, a distance defined between any two adjacent wirings must be greater than or equal to a preset distance.

At present, in order to increase a screen-to-body ratio of the display panel, it is necessary to reduce an area of the non-display region. Because the preset distance defined between the metal wirings cannot be changed, it is difficult to reduce the area of the non-display region.

Therefore, it is necessary to improve this phenomenon.

SUMMARY OF INVENTION

The present application provides a display panel and an electronic device to reduce an area of a non-display region of a display panel.

In order to solve the above problem, the present application provides a display panel, the display panel includes a display region and a non-display region surrounding the display region, the non-display region comprises:

a substrate;

a first wiring layer, wherein the first wiring layer is disposed on the substrate, and the first wiring layer comprises a plurality of first metal wirings arranged in parallel;

a first insulating layer, wherein the first insulating layer covers the first wiring layer and the substrate;

a second wiring layer, wherein the second wiring layer is disposed on the first insulating layer, and the second wiring layer comprises a plurality of second metal wirings arranged in parallel; and a second insulating layer, wherein the second insulating layer covers the second wiring layer and the first insulating layer; and wherein the minimum distance defined between the first wiring layer and the second wiring layer is greater than or equal to a preset distance.

According to one aspect of this application, distances defined between the first metal wirings are the same, a first distance is defined as a distance between any two first metal wirings, and the first distance is greater than or equal to the preset distance; and distances defined between the second metal wirings are the same, a second distance is defined as a distance between two second metal wirings, and the second distance is greater than or equal to the preset distance.

According to one aspect of this application, line widths of the first metal wirings are equal to line widths of the second metal wirings, and projections of the first metal wirings projected on the insulating substrate cover projections of the second metal wirings projected on the insulating substrate.

According to one aspect of this application, projections of the second metal wirings projected on the insulating substrate are staggered arranged with the first metal wirings.

According to one aspect of this application, the non-display region further comprises:

a first attachment layer, wherein the first attachment layer is disposed between the first insulating layer and the second metal layer.

According to one aspect of this application, the first attachment layer is made of a black acrylate adhesive.

According to one aspect of this application, the non-display region further comprises:

a third wiring layer, wherein the third wiring layer is disposed on the second insulating layer, the third wiring layer comprises a plurality of third metal wirings arranged in parallel; and a third insulating layer, wherein the third insulating layer covers the third wiring layer and the second insulating layer;

wherein the minimum distance defined between the second wiring layer and the third wiring layer is greater than or equal to the preset distance;

wherein distances defined between the third metal wirings are the same, a third distance is defined as a distance between two third metal wirings, the third distance is greater than or equal to the preset distance.

According to one aspect of this application, projections of the second metal wirings projected on the insulating substrate are staggered arranged with the first metal wirings.

projections of the third metal wirings projected on the insulating substrate are overlapping with the first metal wirings.

According to one aspect of this application, the first insulating layer, the second insulating layer, and the third insulating layer are made of at least one selected from silicon oxide or silicon nitride.

Correspondingly, the application further provides an electronic device, wherein the electronic device comprises a display panel, the display panel comprises a display region and a non-display region surrounding the display region, the non-display region comprises:

an insulating substrate;

a first wiring layer, wherein the first wiring layer is disposed on the insulating substrate, the first wiring layer comprises a plurality of first metal wirings arranged in parallel;

a first insulating layer, wherein the first insulating layer covers the first wiring layer and the insulating substrate;

a second wiring layer, wherein the second wiring layer is disposed on the first insulating layer, the second wiring layer comprises a plurality of second metal wirings arranged in parallel; and a second insulating layer, wherein the second insulating layer covers the second wiring layer and the first insulating layer;

wherein the minimum distance defined between the first wiring layer and the second wiring layer is greater than or equal to a preset distance.

According to one aspect of this application, distances defined between the first metal wirings are the same, a first distance is defined as a distance between any two first metal wirings, the first distance is greater than or equal to the preset distance; and distances defined between the second metal wirings are the same, a second distance is defined as a distance between two second metal wirings, the second distance is greater than or equal to the preset distance.

According to one aspect of this application, line widths of the first metal wirings are equal to line widths of the second metal wirings, projections of the first metal wirings projected on the insulating substrate cover projections of the second metal wirings projected on the insulating substrate.

According to one aspect of this application, projections of the second metal wirings projected on the insulating substrate are staggered arranged with the first metal wirings.

According to one aspect of this application, the non-display region further comprises:

a first attachment layer, wherein the first attachment layer is disposed between the first insulating layer and the second metal layer.

According to one aspect of this application, the first attachment layer is made of a black acrylate adhesive.

According to one aspect of this application, the non-display region further comprises:

a third wiring layer, wherein the third wiring layer is disposed on the second insulating layer, the third wiring layer comprises a plurality of third metal wirings arranged in parallel; and a third insulating layer, wherein the third insulating layer covers the third wiring layer and the second insulating layer;

wherein the minimum distance defined between the second wiring layer and the third wiring layer is greater than or equal to the preset distance;

wherein distances defined between the third metal wirings are the same, a third distance is defined as a distance between two third metal wirings, the third distance is greater than or equal to the preset distance.

According to one aspect of this application, projections of the second metal wirings projected on the insulating substrate are staggered arranged with the first metal wirings.

projection of the third metal wirings projected on the insulating substrate are overlapping with the first metal wirings.

According to one aspect of this application, the first insulating layer, the second insulating layer, and the third insulating layer are made of at least one selected from silicon oxide or silicon nitride.

The benefit of the present application is: A wiring structure of a non-display region of a display panel of the present application is a multi-layer wiring structure. Compared with a single-layer wiring structure of the prior art, the multi-layer wiring structure significantly reduces an area of wirings, thereby reducing an area of the non-display region and increasing a screen-to-body ratio of the display panel.

DETAILED DESCRIPTION OF PREFERRED EMBODIMENTS

Figure 1:
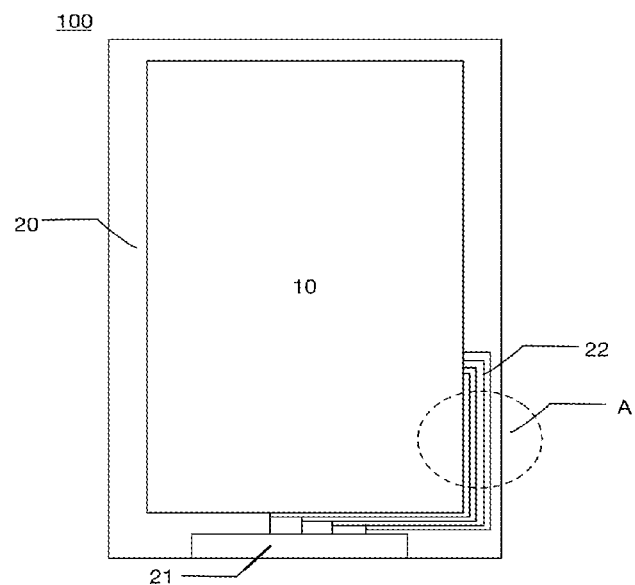
FIG. 1 is a structural schematic diagram of a display panel in prior art.

The following description of the various embodiments is provided to illustrate the specific embodiments of the invention. Directional terms mentioned in the present invention, such as "upper", "lower", "previous", "post", "left", "right", "inside", "outside", "side", etc., are merely references to the direction of the appended drawings. Therefore, the directional terminology used is for the purpose of illustration and understanding of the invention. In the figures, structurally similar elements are denoted by the same reference numerals.

Firstly, a brief description of the existing technology is provided.

Figure 2:
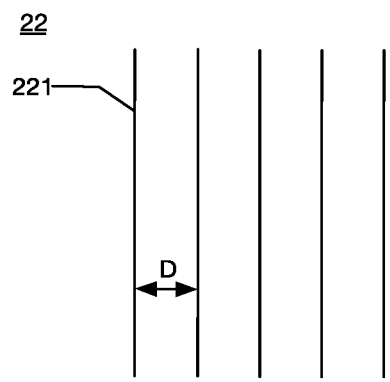
FIG. 2 is an enlarged view of region A of FIG. 1.
Figure 3:
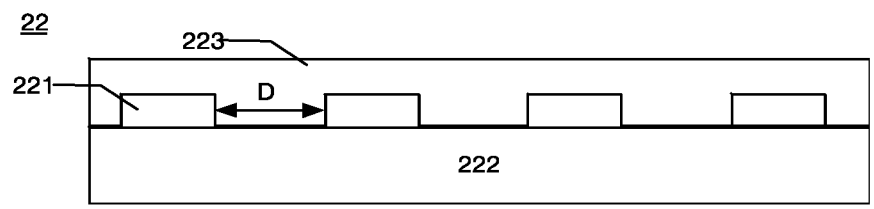
FIG. 3 is a cross-section view of FIG. 2.

Referring to FIGS. 1-3, FIG. 1 is a structural schematic diagram of a display panel in prior art. FIG. 2 is an enlarged view of region A of FIG. 1. FIG. 3 is a cross-section view of FIG. 2. A display panel 100 of prior art includes a display region 10 and a non-display region 20. The non-display region 20 includes a controlling chip 21 and a metal wiring region 22. Referring to FIG. 2, the metal wiring region 22 includes a plurality of metal wirings 221 arranged in parallel. Referring to FIG. 3, the metal wirings 221 are disposed on an insulating substrate 222. An insulating protective layer 223 covers the metal wirings 221 and the insulating substrate 22.

In order to prevent mutual interference of signals occurring between metal wirings, a distance H defined between the metal wirings 221 must be greater than or equal to a preset distance. The preset distance is a minimum distance ensuring mutual interference does not occur between metal wirings. Therefore, a width of a metal wiring region is limited by the preset distance and cannot to be reduced.

In order to solve the above problem, the present application provides a display panel and an electronic device to reduce an area of the non-display region 30 of the display panel.

Figure 4:
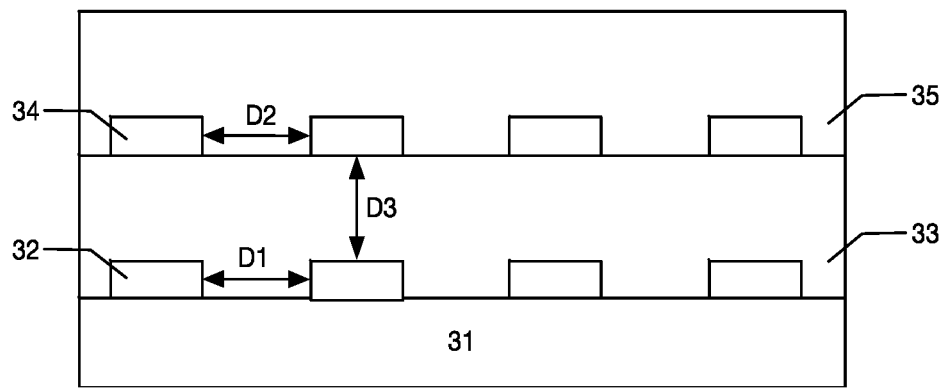
FIG. 4 is a cross-section view of a non-display region of a display panel of a first embodiment according to the present application.

The present application provides a display panel. The display panel includes a display region and a non-display region 30 surrounding the display region. Referring to FIG. 4, the non-display region 30 includes an insulating substrate 31, a first wiring layer 32, a first insulating layer 33, a second wiring layer 34, and a second insulating layer 35.

The first wiring layer 32 is disposed on the insulating substrate 31. The first wiring layer 32 includes a plurality of first metal wirings arranged in parallel. The first insulating layer 33 covers the first wiring layer 32 and the insulating substrate 31. The second wiring layer 34 is disposed on the first insulating layer 33. The second wiring layer 34 includes a plurality of second metal wirings arranged in parallel. The second insulating layer 35 covers the second wiring layer 34 and the first insulating layer 33. The first insulating layer 33 is made of silicon oxide or silicon nitride. The second insulating layer 35 is made of silicon oxide or silicon nitride.

In the present application, in order to prevent mutual interference occurring between the first metal wirings and the second metal wirings, a minimum distance D3 defined between the first wiring layer 32 and the second wiring layer 34 is greater than or equal to a preset distance. The preset distance is the minimum distance ensuring mutual interference does not occur between the first wiring layer 32 and the second wiring layer 34. The minimum distance D3 defined between the first wiring layer 32 and the second wiring layer 34 is the minimum distance defined between a surface of the first wiring layer 32 facing the second wiring layer 34 and a surface of the second wiring layer 34 facing the first wiring layer 32.

In the present application, distances defined between the first metal wirings are the same. A first distance D1 is defined as a distance between two adjacent first metal wirings. The first distance D1 is greater than or equal to the preset distance. Distances defined between the second metal wirings are the same. A second distance D2 is defined as a distance between two adjacent second metal wirings. The second distance D2 is greater than or equal to the preset distance. In order to minimize distances defined between the first metal wirings and the second metal wirings, in this embodiment, the first distance D1 is equal to the second distance D2, and equal to the preset distance.

Referring to FIG. 4, in this embodiment, line widths of the first metal wirings are equal to line widths of the second metal wirings, projections of the first metal wirings projected on the insulating substrate 31 cover projections of the second metal wirings projected on the insulating substrate 31 to make the first wiring layer 32 and the second wiring layer 34 easily manufactured by a same mask and to save manufacturing cost.

Figure 5:
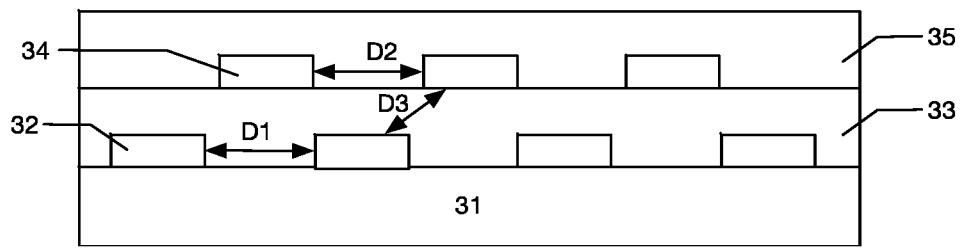
FIG. 5 is a cross-section view of a non-display region of a display panel of a second embodiment according to the present application.
Figure 6:
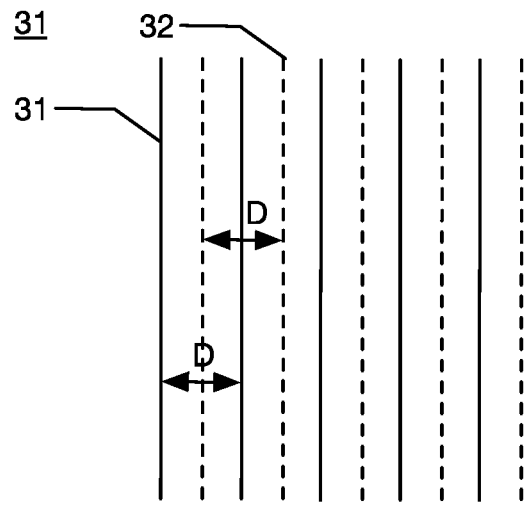
FIG. 6 is a top view of FIG. 5.

Referring to FIGS. 5 and 6, in a second embodiment of the present application, projections of the second metal wirings projected on the insulating substrate 31 are staggered arranged with gaps disposed between the first metal wirings, that is, the first metal wirings and the second metal wirings are cross set. Such setting makes a minimum distance D3 defined between the first wiring layer 32 and the second wiring layer 34 are greater than a thickness of the first insulating layer 33, thereby making the D3 be less than the preset distance and reducing the thickness of the first insulating layer 33.

Figure 7:
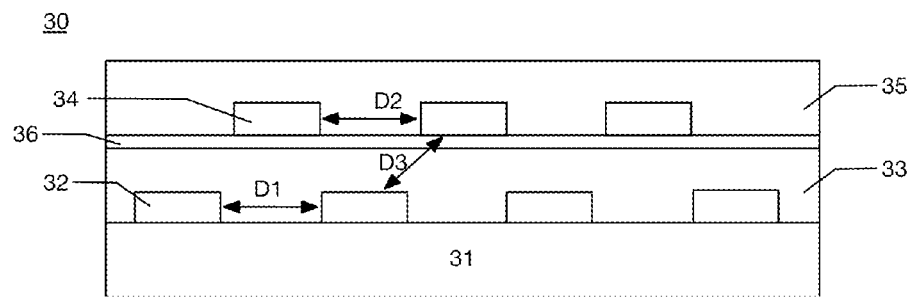
FIG. 7 is a cross-section view of a non-display region of a display panel of a third embodiment according to the present application.

Referring to FIG. 7, in a third embodiment of the present application, the non-display region 30 also includes a first attachment layer 36. The first attachment layer 36 is disposed between the first insulating layer 33 and the second metal layer 35. A surface adhesion between the first attachment layer 36 and the second metal wirings 34 is greater than a surface adhesion between the second insulating layer 35 and the second metal wirings 34. In this embodiment, the first attachment layer 36 is made of a black acrylate adhesive. The black acrylate adhesive can polymerize within a small shadow region, has a high elongation at break, and can effectively improve the adhesion between the second metal wirings 34 and the second insulating layer 35 to prevent the second metal wirings 34 and the second insulating layer 35 from being separated by bending or external force. Correspondingly, because the black acrylate adhesive is used, the adhesion of the first attachment layer 36 disposed between the first insulating layer 33 and second insulating layer 35 is greater than an adhesion between the first insulating layer 33 and second insulating layer 35, thereby increasing a stability of a structure.

Figure 8:
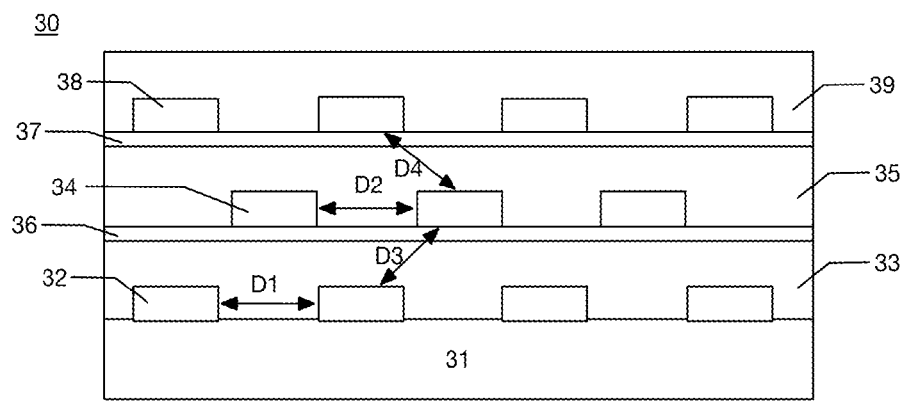
FIG. 8 is a cross-section view of a non-display region of a display panel of a fourth embodiment according to the present application.

Referring to FIG. 8, in a fourth embodiment of the present application, the non-display region 30 further includes a third wiring layer 38 and a third insulating layer 39. The third wiring layer 38 is disposed on the second insulating layer 35. The third wiring layer 38 includes a plurality of third metal wirings arranged in parallel. The third insulating layer 39 covers the third wiring layer 38 and the second insulating layer 35. In this embodiment, a minimum distance D4 defined between the second wiring layer 34 and the third wiring layer 38 is greater than or equal to the preset distance. The preset distance is the minimum distance ensuring mutual interference does not occur between the second wiring layer 34 and the third wiring layer 38. Distances defined between the third metal wirings are the same. A third distance D5 is defined as a distance between two adjacent third metal wirings. The third distance D5 is greater than or equal to the preset distance.

Similarly, in order to increase an adhesion between an insulating layer and a metal layer, the display region of the present application further includes a second attachment layer 37. The second attachment layer 37 is disposed between the third insulating layer 39 and the second insulating layer 35. A surface adhesion between the second attachment layer 37 and the third wiring layer 38 is greater than a surface adhesion between the second insulating layer 35 and the third wiring layer 38. The second attachment layer 37 is made of a black acrylate adhesive.

In this embodiment, projections of the second metal wirings projected on the insulating substrate 31 are staggered arranged with the first metal wirings. The third metal wirings projected on the insulating substrate 31 overlap with the first metal wirings. Such setting can minimize a thickness of the non-display region and prevent a structural imbalance of the display panel from occurring due to an excessive thickness of the non-display region 30.

Correspondingly, the present application further provides an electronic device, and the electronic device includes the display panel as mentioned above.

A wiring structure of the non-display region of the display panel of the present application is a multi-layer wiring structure. Compared with a single-layer wiring structure of prior art, the multi-layer wiring structure significantly reduces an area of the wirings, thereby reducing an area of the non-display region and increasing a screen-to-body ratio of the display panel.

In summary, although the present application has been disclosed above with preferred embodiments, the above preferred embodiments are not intended to limit the application. Those skilled in the art can make various modifications without departing from the spirit and scope of the application. This kind of modification and retouching, therefore, the protection scope of this application shall be subject to the scope defined by the claims.

What is claimed is:

1. A display panel, wherein the display panel comprises a display region and a non-display region surrounding the display region, the non-display region comprises:
   an insulating substrate;
   a first wiring layer, wherein the first wiring layer is disposed on the insulating substrate, and the first wiring layer comprises a plurality of first metal wirings arranged in parallel;
   a first insulating layer, wherein the first insulating layer covers the first wiring layer and the insulating substrate;
   a second wiring layer, wherein the second wiring layer is disposed on the first insulating layer, and the second wiring layer comprises a plurality of second metal wirings arranged in parallel; and
   a second insulating layer, wherein the second insulating layer covers the second wiring layer and the first insulating layer;
   wherein a minimum distance defined between the first wiring layer and the second wiring layer is greater than or equal to a preset distance;
   wherein the non-display region further comprises:

a third wiring layer, wherein the third wiring layer is disposed on the second insulating layer, and the third wiring layer comprises a plurality of third metal wirings arranged in parallel; and a third insulating layer, wherein the third insulating layer covers the third wiring layer and the second insulating layer;

wherein a minimum distance defined between the second wiring layer and the third wiring layer is greater than or equal to the preset distance;

wherein distances defined between the third metal wirings are the same, a third distance is defined as a distance between two third metal wirings, and the third distance is greater than or equal to the preset distance; and wherein projections of the second metal wirings projected on the insulating substrate are staggered arranged with the first metal wirings; and projections of the third metal wirings projected on the insulating substrate are overlapping with the first metal wirings.

2. The display panel of claim 1, wherein distances defined between the first metal wirings are the same, a first distance is defined as a distance between any two first metal wirings, and the first distance is greater than or equal to the preset distance; and distances defined between the second metal wirings are the same, a second distance is defined as a distance between two second metal wirings, and the second distance is greater than or equal to the preset distance.

3. The display panel of claim 1, wherein line widths of the first metal wirings are equal to line widths of the second metal wirings, and projections of the first metal wirings projected on the insulating substrate cover projections of the second metal wirings projected on the insulating substrate.

4. The display panel of claim 1, wherein projections of the second metal wirings projected on the insulating substrate are staggered arranged with the first metal wirings.

5. The display panel of claim 1, wherein the non-display region further comprises: a first attachment layer, wherein the first attachment layer is disposed between the first insulating layer and the second wiring layer.

6. The display panel of claim 5, wherein the first attachment layer is made of a black acrylate adhesive.

7. The display panel of claim 1, wherein the first insulating layer, the second insulating layer, and the third insulating layer are made of at least one selected from silicon oxide or silicon nitride.

8. An electronic device, wherein the electronic device comprises a display panel, the display panel comprises a display region and a non-display region surrounding the display region, and the non-display region comprises:

an insulating substrate;

a first wiring layer, wherein the first wiring layer is disposed on the insulating substrate, the first wiring layer comprises a plurality of first metal wirings arranged in parallel;

a first insulating layer, wherein the first insulating layer covers the first wiring layer and the insulating substrate;

a second wiring layer, wherein the second wiring layer is disposed on the first insulating layer, and the second wiring layer comprises a plurality of second metal wirings arranged in parallel; and a second insulating layer, wherein the second insulating layer covers the second wiring layer and the first insulating layer;

wherein a minimum distance defined between the first wiring layer and the second wiring layer is greater than or equal to a preset distance;

wherein the non-display region further comprises:

a third wiring layer, wherein the third wiring layer is disposed on the second insulating layer, and the third wiring layer comprises a plurality of third metal wirings arranged in parallel; and a third insulating layer, wherein the third insulating layer covers the third wiring layer and the second insulating layer;

wherein a minimum distance defined between the second wiring layer and the third wiring layer is greater than or equal to the preset distance;

wherein distances defined between the third metal wirings are the same, a third distance is defined as a distance between two third metal wirings, and the third distance is greater than or equal to the preset distance; and wherein projections of the second metal wirings projected on the insulating substrate are staggered arranged with the first metal wirings; and projections of the third metal wirings projected on the insulating substrate are overlapping with the first metal wirings.

9. The electronic device of claim 8, wherein distances defined between the first metal wirings are the same, a first distance is defined as a distance between any two first metal wirings, and the first distance is greater than or equal to the preset distance; and distances defined between the second metal wirings are the same, a second distance is defined as a distance between two second metal wirings, and the second distance is greater than or equal to the preset distance.

10. The electronic device of claim 8, wherein line widths of the first metal wirings are equal to line widths of the second metal wirings, and projections of the first metal wirings projected on the insulating substrate cover projections of the second metal wirings projected on the insulating substrate.

11. The electronic device of claim 8, wherein projections of the second metal wirings projected on the insulating substrate are staggered arranged with the first metal wirings.

12. The electronic device of claim 8, wherein the non-display region further comprises: a first attachment layer, wherein the first attachment layer is disposed between the first insulating layer and the second wiring layer.

13. The electronic device of claim 12, wherein the first attachment layer is made of a black acrylate adhesive.

14. The electronic device of claim 8, wherein the first insulating layer, the second insulating layer, and the third insulating layer are made of at least one selected from silicon oxide or silicon nitride.

* * * * *